US010541686B1

(12) United States Patent
Schultz et al.

(10) Patent No.: US 10,541,686 B1
(45) Date of Patent: Jan. 21, 2020

(54) CIRCUIT AND METHOD FOR ENSURING A STABLE IO INTERFACE DURING PARTIAL RECONFIGURATION OF A REPROGRAMMABLE INTEGRATED CIRCUIT DEVICE

(71) Applicant: Xilinx, Inc., San Jose, CA (US)

(72) Inventors: David P. Schultz, Longmont, CO (US); David Robinson, Loanhead (GB); Kusuma Bathala, San Jose, CA (US); Wenyi Song, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/192,053

(22) Filed: Nov. 15, 2018

(51) Int. Cl.
*H03K 19/177* (2006.01)

(52) U.S. Cl.
CPC ... *H03K 19/17756* (2013.01); *H03K 19/1776* (2013.01); *H03K 19/17744* (2013.01); *H03K 19/17752* (2013.01)

(58) Field of Classification Search
CPC .... G06F 13/4291; G06F 17/5031; G06F 1/08; G06F 1/12; G06F 21/76; G06F 15/7867; G06F 17/5054; H03K 19/17728; H03K 19/0016; H03K 19/1776; H03K 19/17792; H03K 19/1774; H03K 19/01855; H03K 19/17744; H03K 19/17756; G11C 7/10
See application file for complete search history.

(56) References Cited

U.S. PATENT DOCUMENTS

| | | | |
|---|---|---|---|
| 6,119,200 A | 9/2000 | George | |
| 6,810,514 B1 | 10/2004 | Alfke et al. | |
| 6,836,842 B1 | 12/2004 | Guccione et al. | |
| 7,302,625 B1 | 11/2007 | Payakapan et al. | |
| 7,477,072 B1 | 1/2009 | Kao et al. | |
| 7,546,572 B1 | 6/2009 | Ballagh et al. | |
| 7,640,527 B1 | 12/2009 | Dorairaj et al. | |
| 7,836,331 B1 | 11/2010 | Totolos, Jr. | |
| 8,294,490 B1 * | 10/2012 | Kaviani | H03K 19/01855 326/101 |
| 8,324,930 B1 * | 12/2012 | Jenkins, IV | H03K 19/17744 326/38 |
| 8,358,148 B1 * | 1/2013 | Kaviani | H03K 19/1736 326/38 |
| 8,415,974 B1 * | 4/2013 | Lysaght | H03K 19/17756 326/39 |
| 8,560,996 B1 | 10/2013 | Brebner et al. | |

(Continued)

OTHER PUBLICATIONS

JEDEC Standard JESD79-3C "DDR3 SDRAM", Nov. 2008.
(Continued)

*Primary Examiner* — Vibol Tan
(74) *Attorney, Agent, or Firm* — John J. King.

(57) ABSTRACT

A circuit for routing data in an integrated circuit device is described. The circuit comprises an input/output port; an interface circuit coupled to the input/output port and configured to receive data, the interface circuit comprising a selection circuit enabling the selection of the data and a predetermined value; and a control circuit coupled to control the selection circuit; wherein the control circuit holds the input/output port at the predetermined value during a partial reconfiguration of the integrated circuit device in response to a control signal. A method of configuring a circuit for routing data in an integrated circuit device is also described.

20 Claims, 7 Drawing Sheets

(56) References Cited

U.S. PATENT DOCUMENTS

| | | | |
|---|---|---|---|
| 8,786,310 B1 | | 7/2014 | Lu et al. |
| 8,788,756 B2 | * | 7/2014 | Kulkarni ............. G06F 13/4291 |
| | | | 711/114 |
| 8,913,601 B1 | * | 12/2014 | Kaviani ........... H03K 19/01859 |
| | | | 326/38 |
| 9,153,311 B1 | | 10/2015 | Tewalt |
| 9,183,339 B1 | | 11/2015 | Shirazi et al. |
| 9,500,700 B1 | * | 11/2016 | Wang ................. G01R 31/2851 |
| 9,606,572 B2 | * | 3/2017 | Sood ......................... G06F 1/08 |
| 9,660,847 B2 | * | 5/2017 | Navid ............... H04L 25/03343 |
| 9,722,613 B1 | | 8/2017 | Schultz et al. |
| 2011/0264934 A1 | | 10/2011 | Branover et al. |

OTHER PUBLICATIONS

Dimitris Syrivelis and Spyros Lalis, "System- and Application-level Support for Runtime Hardware Reconfiguration on SoC Platforms" 2006 Annual Technical Conference Refereed Paper, from usenix.org.

Dimitris Syrivelis and Spyros Lalis, "System- and Applicationl-level Support for Runtime Hardware Reconfiguration on SoC Platforms" in Proceedings of the 2006 USENIX Annual Technical Conference, May 30-Jun. 3, 2006, Boston, MA, pp. 315-327.

"Suzaku Hardware Manual Version 1.0.04", Atmark Techno, Inc., Dec. 14, 2004.

* cited by examiner

US 10,541,686 B1

CIRCUIT AND METHOD FOR ENSURING A STABLE IO INTERFACE DURING PARTIAL RECONFIGURATION OF A REPROGRAMMABLE INTEGRATED CIRCUIT DEVICE

TECHNICAL FIELD

The present invention relates generally to integrated circuit devices, and in particular, to a circuit and method for ensuring a stable IO interface during partial reconfiguration of a reprogrammable integrated circuit device.

BACKGROUND

Programmable logic devices are integrated circuit devices that enable a user of the integrated circuit to program the device using circuit designs of the user's choice. Programmable logic devices can be reconfigured as desired, and often undergo a partial reconfiguration (PR). While partial reconfigurations are beneficial, they can also have drawbacks or lead to adverse consequences. In most systems that use partial reconfiguration, the external input/output (IO) interfaces are fixed and cannot be reconfigured. However, the programmable logic which connects to these interfaces may rely on multiple Partial Reconfigurations as part of normal system operations.

Accordingly, there is a need for an IO circuit that provides predictable and acceptable performance during a partial reconfiguration.

SUMMARY

A circuit for providing stable values, such as on an external input/output interface during partial reconfiguration, in an integrated circuit device is described. The input/output circuit comprises an input/output port; an interface circuit coupled to the input/output port and configured to receive data, the interface circuit comprising a selection circuit enabling the selection of the data and a predetermined value; and a control circuit coupled to control the selection circuit; wherein the control circuit holds the input/output port at the predetermined value during a partial reconfiguration of the integrated circuit device in response to a control signal.

A method for providing stable values, such as on an external input/output interface during partial reconfiguration, in an integrated circuit device is also described. The method comprises coupling an interface circuit to an input/output port, wherein the input/output port is configured to receive data, and the interface circuit comprises a selection circuit enabling the selection of the data and a predetermined value; configuring the control circuit to control the selection circuit; and holding the input/output port at the predetermined value during a partial reconfiguration of the integrated circuit device in response to a control signal from the control circuit.

DETAILED DESCRIPTION

The circuits and methods of implementing an IO interface enable holding a value at an output of an integrated circuit at a particular voltage during a PR event. According to some implementations, an output value can be synchronously switched to a programmable constant value for the duration of a PR event using the existing clock for the output path. That is, the IO interface enables predefined constant values to be switched in synchronously when a hold signal is asserted. A tristate control value for a tri-state buffer of the IO interface could also be synchronously switched to a programmable constant value for the duration of a PR event using the existing clock for the tristate path. Therefore, IO programming can be retained during a PR event and can be selected on a per-IO pair basis. According to other implementations, an asynchronous operation could be employed, where constant values are switched in when a hold signal is asserted. As will be described in more detail below, the circuits and methods provide a stable IO during a partial reconfiguration of an integrated circuit device by holding values at an IO interface at fixed values.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
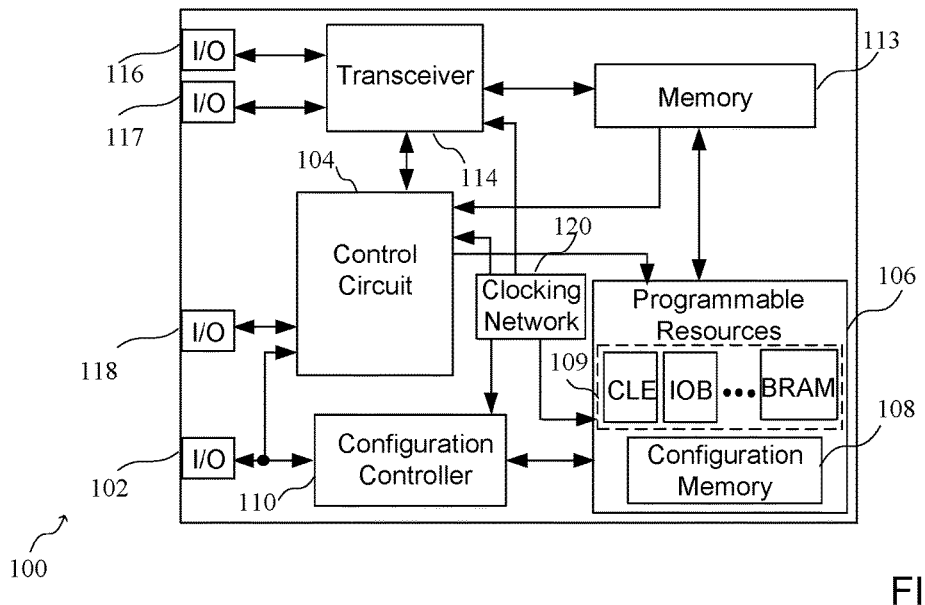
FIG. 1 is a block diagram of an integrated circuit having IO circuits.

Turning first to FIG. 1, a block diagram of an integrated circuit device 100 having IO circuits is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which comprises a transmitter and a receiver, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, other circuits of implementing IO circuits of other circuits requiring that data values be held during a partial reconfiguration could be used.

Figure 2:
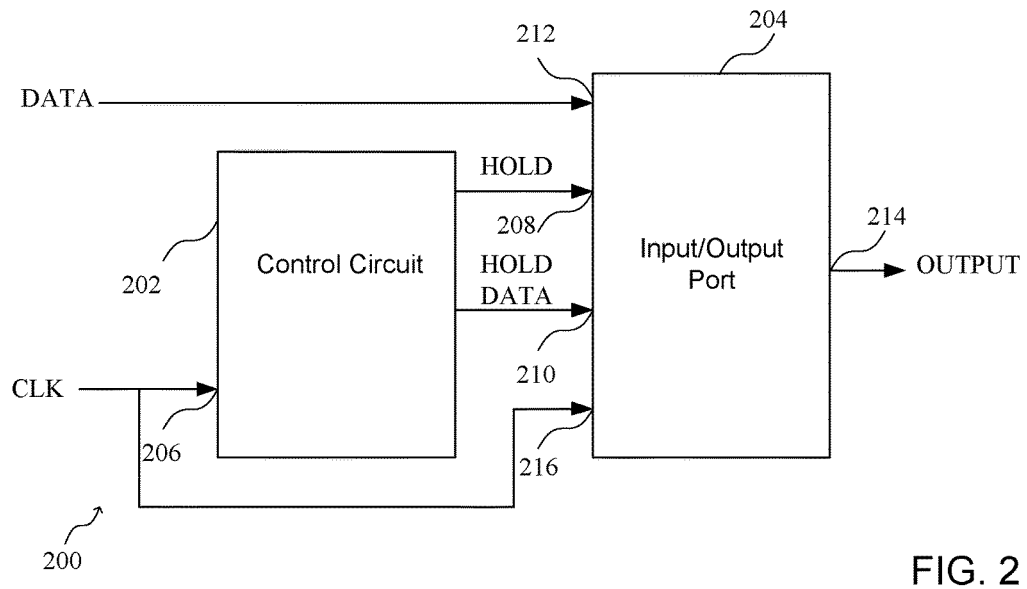
FIG. 2 is a block diagram of an IO circuit of an integrated circuit device.

Turning now to FIG. 2, a block diagram of an IO circuit 200 of an integrated circuit device is shown. A control circuit 202 is coupled to an input/output port 204. The control circuit 202 receives a clock signal at a clock input 206, and generates a hold (HOLD) signal that is provided to a control input 208 and data (HOLD DATA) that is provided to a first data input 210. As will be described in more detail below, the HOLD DATA is a voltage at which output data (OUTPUT) of the IO port 204 is held. In addition to receiving the hold signal and the hold data, data is provided to the IO circuit at a second data input 212 to be generated at an output 214 as output data (Output) during normal operation (i.e. operation outside of a partial reconfiguration). The IO port 204 may also receive the clock signal at a second clock input 216.

While an input/output port is shown, it should be understood that input/output port 204 could be a dedicated input circuit or a dedicated output circuit. The circuit of FIG. 2 could be implemented in an IO block of FIG. 1 or in input/output logic (IOL) of FIG. 10, for example. As will be described in more detail below, the output data generated by the output 214 could be used to hold a voltage at a node of another circuit, such as a memory circuit, which is a part of the integrated circuit having the input/output circuit 200, or separate from the integrated circuit having the input/output circuit 200 for example. While FIG. 2, as well as FIGS. 3-6 as described in more detail below, describe holding a value as an output of an input/output port at a fixed value during a partial reconfiguration, it should be understood that the circuits and methods could be used for holding an input/output port that is intended to operate as an input port at a predetermined value. For example, in the implementation of FIG. 2, input data could be coupled to the port 214 (i.e. the input/output port is operating as an input), and the input data could be generated at 212 (i.e. input 212 functions as an output), or 212 could generate a fixed value. That is, the control circuit 202 could control the input/output port 204 to operate as an input port, where the node that routes the received data (i.e. input 212 operating as an output of the input output port 204) is held at a fixed value.

Figure 3:
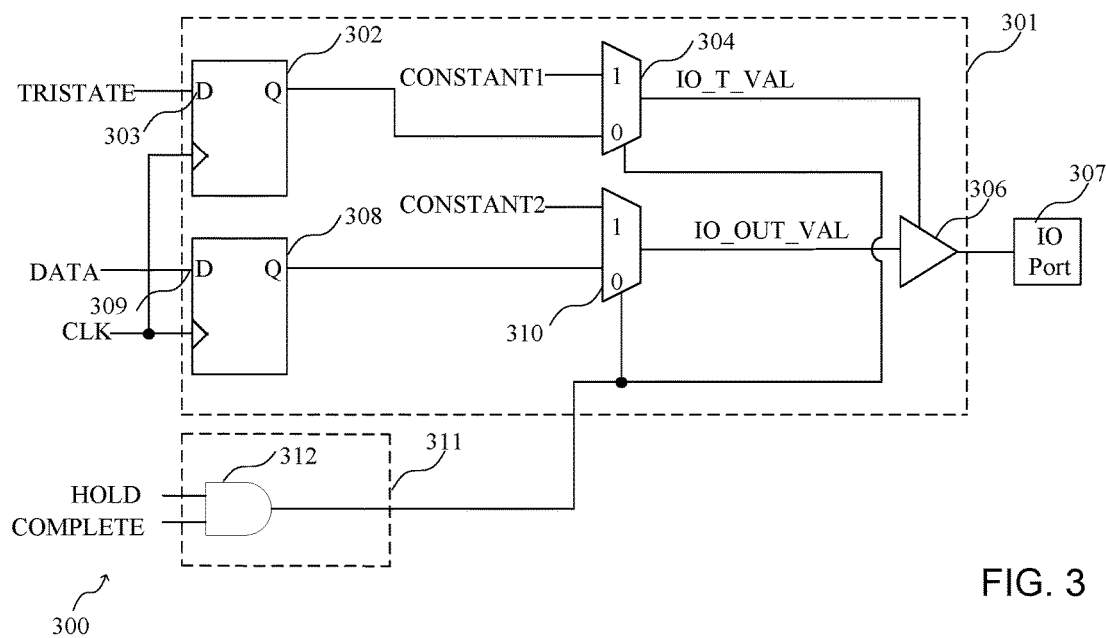
FIG. 3 is a block diagram of an asynchronous IO circuit for an integrated circuit device.

Turning now to FIG. 3, a block diagram of an asynchronous IO circuit 300 for an integrated circuit device is shown. According to the implementation of FIG. 3, an interface circuit 301 is a circuit coupled to the input/output port and comprises a first register 302, shown here by way of example as a flip-flop, that is configured to receive a tristate (TRISTATE) signal at an input 303 and receive a clock (CLK) signal at a clock input. An output of the register 302 is coupled to a selection circuit 304, an output of which is selected a tristate control signal (IO_T_VAL) that controls a tristate buffer 306. An output of the tristate buffer is coupled to a IO pad 307. A control terminal of the selection circuit 304 is used to select either the tristate control signal generated by the register 302, or a constant (CONSTANT1) value, which is a predetermined voltage. As will be described in more detail below, the constant value may be selected during a partial reconfiguration operation.

Data is also routed to the IO pad 307 by way of a register 308 having an input 309 for receiving the data (DATA) that is generated at the IO port during normal operation of the integrated circuit (e.g. operation outside of a partial reconfiguration operation). A clock input also receives the clock signal. A selection circuit 310, also shown by way of example as a multiplexer, enables a selection of the data generated by the register 308 or a constant (CONSTANT2) value to be provided as the IO_OUT_VAL signal to the data input of the tristate buffer 306. The constant value could be selected by the selection circuit 310 and provided as the IO_OUT_VAL signal to the data input of the tristate buffer 306 to enable holding a value at the IO pad 307 at a predetermined voltage (i.e. a logical "0" or logical "1"), such as during a partial reconfiguration operation.

The selection circuit 304 and the selection circuit 310 are controlled by control signal generated by a control circuit 311 and provided to a control terminal of the selection circuits. More particularly, an output of a logic circuit 312 of the control circuit 311, shown here by way of example as including an AND gate 312, is configured to receive a hold (HOLD) signal and a complete (COMPLETE) signal. The HOLD signal can be used as a request for a partial reconfiguration, and the COMPLETE signal can be used to indicate that the status of an initial configuration is complete, after which a partial reconfiguration could be performed. During operation, the hold signal and the complete signal are used to generate an output that will select the tristate and data signals used during normal operation to provide data to the IO pad 307 or provide a fixed, predetermined value to the IO pad, such as during a partial reconfiguration.

Figure 4:
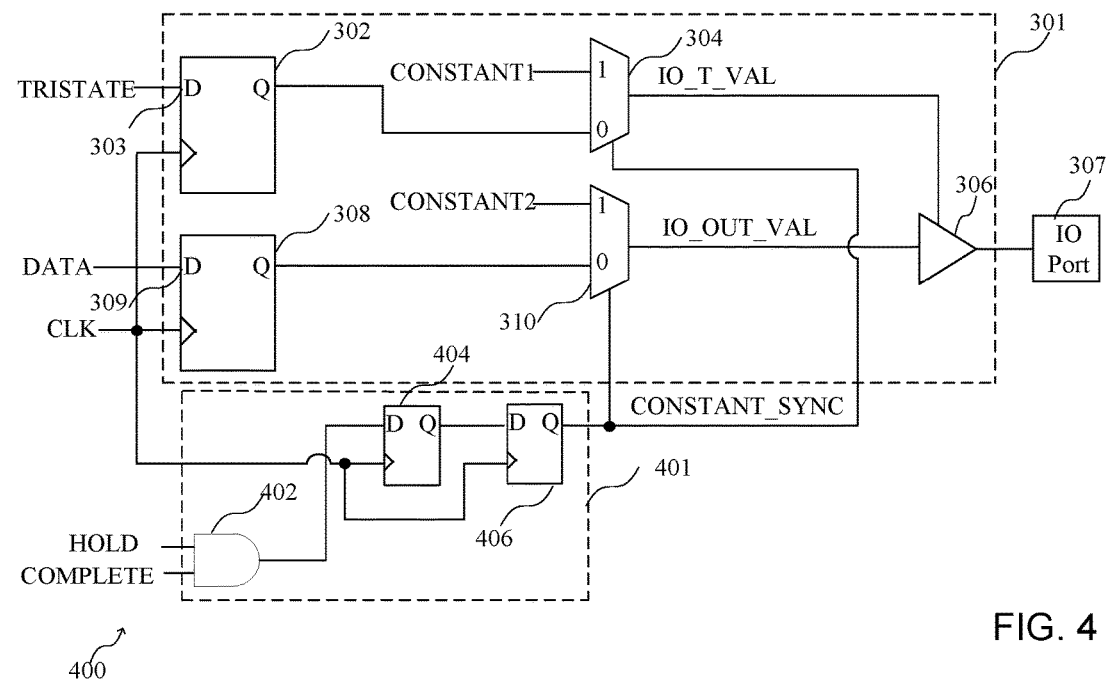
FIG. 4 is a block diagram of a synchronous IO circuit for an integrated circuit device.
Figure 5:
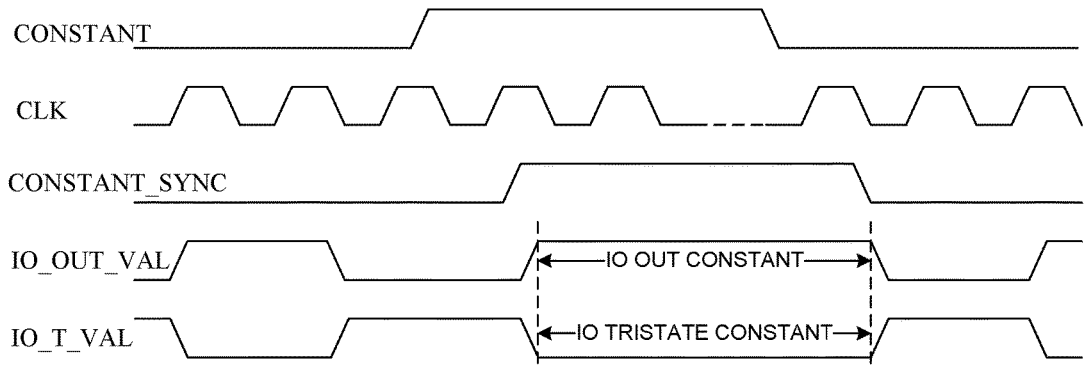
FIG. 5 is a timing diagram showing an operation of the synchronous IO circuit of FIG. 4.

Turning now to FIG. 4, a block diagram of a synchronous IO circuit 400 for an integrated circuit device is shown. According to the implementation of FIG. 4, a control circuit 401 also comprises a logic circuit 402, shown by way of example as an AND gate, and registers 404 and 406 implemented in series at the output of the logic circuit 402 to ensure that the selection of the signals generated by the selection circuits 304 and 310 are synchronized with the tristate and data inputs to the registers 302 and 308. As shown in the timing diagram of FIG. 5, a constant synchronization (CONSTANT SYNC) signal generated at the output of the control circuit 401 enables synchronizing the tristate control and data values (IO_OUT_VAL and IO_T_VAL) during partial reconfiguration.

Figure 6:
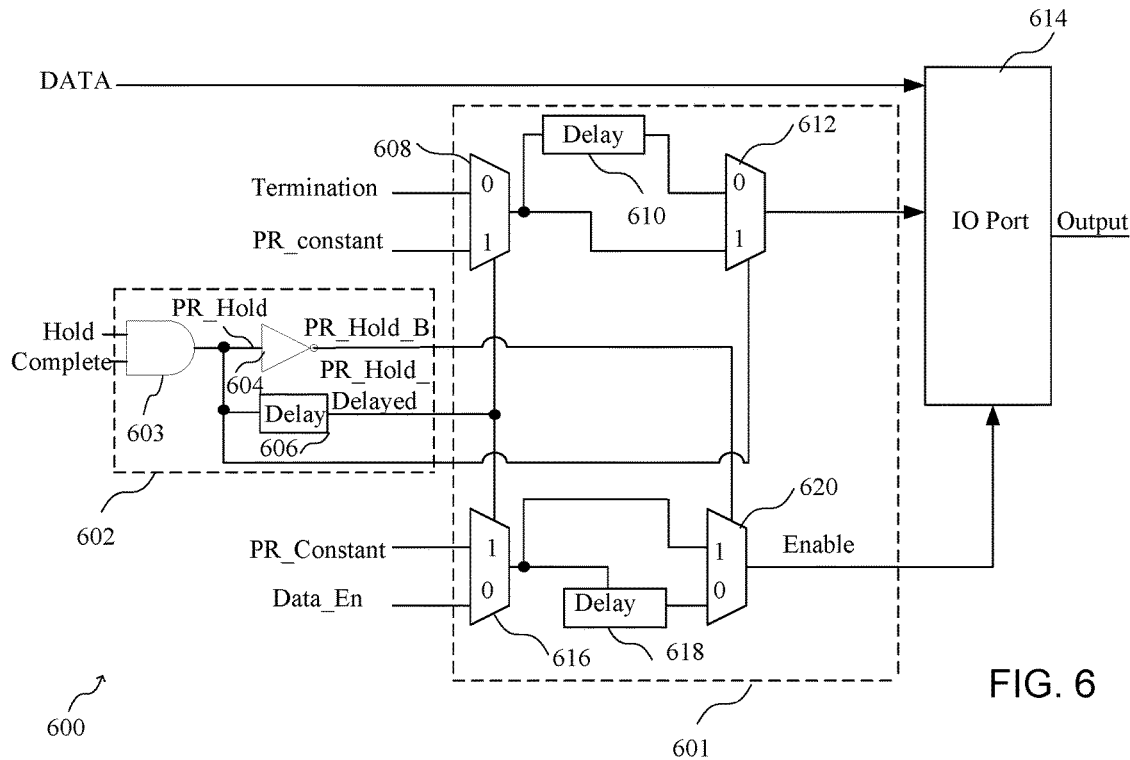
FIG. 6 is a block diagram of another IO circuit of an integrated circuit device.

Turning now to FIG. 6, a block diagram of another IO circuit 600 of an integrated circuit device is shown. The IO circuit 600 comprises an interface circuit 601 that is controlled by a control circuit 602. A logic circuit 603, shown here by way of example as an AND gate, of the control circuit 602 is configured to receive a hold (Hold) signal and a complete (Complete) signal. An output of the logic circuit 603 is a partial reconfiguration hold (PR_Hold) signal coupled to an inverter 604 that is configured to generate an inverted partial reconfiguration hold (PR_Hold_B) signal and a delayed partial reconfiguration hold (PR_Hold_Delayed) signal, generated by a delay element 606. The partial reconfiguration hold signals, including PR_Hold, PR_Hold_B, and PR_Hold_Delayed, are used to control a plurality of selection circuits, shown here by way of example as multiplexers.

A first selection circuit 608 is configured to receive a termination (Termination) value and partial reconfiguration (PR_constant) value (i.e. the value at which the output is held during a partial reconfiguration), where an output is generated in response to the PR_Hold_Delayed signal provided to a selection input of the selection circuit 608. The output and a delayed output, generated by way of a delay element 610, of the first selection circuit 608 are coupled to another selection circuit 612, wherein a data input to the IO port 614 is generated in response to the PR_Hold signal provided to a control terminal of the selection circuit 612. When the Termination value is selected by the selection circuit 608, an impedance of the IO port 614 can be controlled to enable receiving the input data (DATA) at the IO port. When the PR_Constant is selected by the selection circuit 608, the output of the IO port 614 can be held at a predetermined value, such as during a partial reconfiguration.

Additional circuit elements are provided in the IO circuit 600 to enable the IO port 614. A selection circuit 616 is coupled to receive an enable signal (Data_EN) for normal operation and a partial reconfiguration enable signal (PR_Constant). An output and a delayed output generated by the delay element 618 are provided to inputs of a selection circuit 620, which generates an enable (Enable) signal for the IO port 614 in response to the PR_Hold_B signal provided to a control terminal of the selection circuit 620. The enable signal enables the IO port 614 to generate an output based upon the Data or an output of the selection circuit 612 provided to the IO circuit 614. That is, the data generated at the output of the IO port may comprise data that is being generated during normal operation of the IO circuit 614, or a predetermined, fixed value used to hold a value at the output of the IO circuit, such as for an external circuit (e.g. a memory) during a partial reconfiguration. It should be noted that the Termination value, PR_constant value, and Data_En value could be stored in registers having outputs coupled to the selection circuits 608 and 616.

The delay elements may be included to ensure that there is a make-before-break connection. More particularly, the delay element 606 is used to generate a delayed PR Hold signal to not select an output of selection circuits 608 and 616 until 612 and 620 are selected. The delay element 618 can be used to delay the data enable value (i.e. Data_En) so that the termination value (i.e. termination) is ready before the data sent during normal operation (DATA) is no longer available. Therefore, the delay element 618 ensures that the output signal is always either a logical 0 or 1. Further, when coming out of a hold of the values on the output during a PR hold, it is beneficial to delay the termination value generated at the output of the selection circuit 608, such as by using delay element 610. It should also be noted that the operation of selection circuits 612 and 620 are opposite, and that when entering a PR hold mode, the delayed output of multiplexer 608 is used, and when exiting the PR Hold mode, the delayed output of multiplexer 616 is used. As described above in reference to FIG. 2, the input/output ports 307 and 614 of FIGS. 3, 4 and 6 could also operate as an input port, where the value at input port is held at a fixed value.

Figure 7:
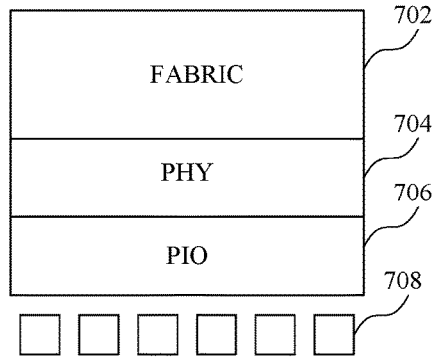
FIG. 7 is a block diagram of portions of an integrated circuit device associated with IO pads of an integrated circuit device.

Turning now to 7, a block diagram of portions of an integrated circuit device associated with the operation of IO pads of an integrated circuit device is shown. The portions of the integrated circuit of FIG. 7 comprises fabric 702, which may include programmable resources of a programmable logic device, such as described in reference to FIGS. 10 and 11, a physical (PHY) interface 704, a physical IO (P1O) 706 and contact elements 708, such as contact pads of an integrated circuit device or other connective elements that are used to make an electrical connection between one circuit and another circuit. The circuits and methods for holding a voltage value at a contact element 708 may be implemented in the PIO 706 for example, and may be controlled by circuits in the fabric 702 and the PHY 704. According to other implementations, the IO interface could also be placed between Fabric and PHY, which may require more multiplexers and constant programming values. The IO circuits can be used with different IO Interface types. For example, the IO can be connected through a physical interface (PHY) to a Hard double data rate memory controller (DDRMC) where no connections to the fabric are required, through the PHY to fabric of a programmable logic device, through PHY (Component) fabric, and to fabric through PHY feedthrough for example.

Figure 8:
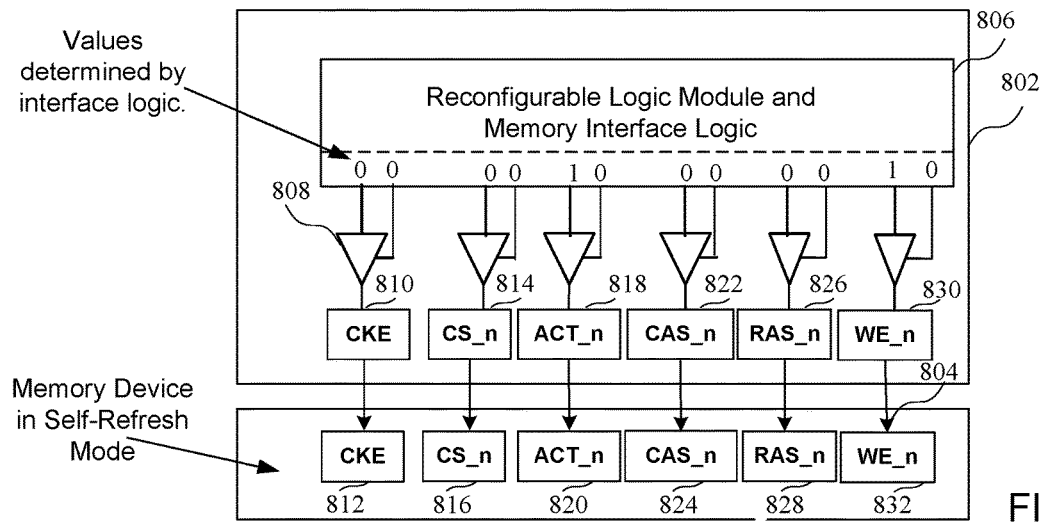
FIG. 8 is a block diagram showing an implementation of an IO circuit coupled to a memory element.

Turning now to FIG. 8, a block diagram shows an implementation of an IO circuit coupled to a memory element. A first circuit 802, which may be an integrated circuit such as a programmable logic device for example, is coupled to a second circuit, which may be a memory circuit such as a double data rate 4 (DDR4) memory for example. A reconfigurable logic module 806 comprising memory interface logic generates logic values (i.e. logic "1" or "0") at a plurality of outputs, shown here by way of example as tristate buffers configured to receive both data and tristate control signals. A plurality of output pads of the first circuit 802 and corresponding input pads of the second circuit 804 include a clock enable (CKE) output pad 810 coupled to a corresponding clock enable input pad 812, a chip select (CS_n) pad 814 coupled to a corresponding chip select pad 816, an activate open row (ACT_n) pad 818 coupled to a corresponding activate open row pad 820, a column address select (CAS_n) pad 822 coupled to a corresponding column address select pad 824, a row address select (RAS_n) pad 826 coupled to a corresponding row address select pad 828, and a write enable (WE_n) pad 830 coupled to a corresponding write enable pad 832.

Figure 9:
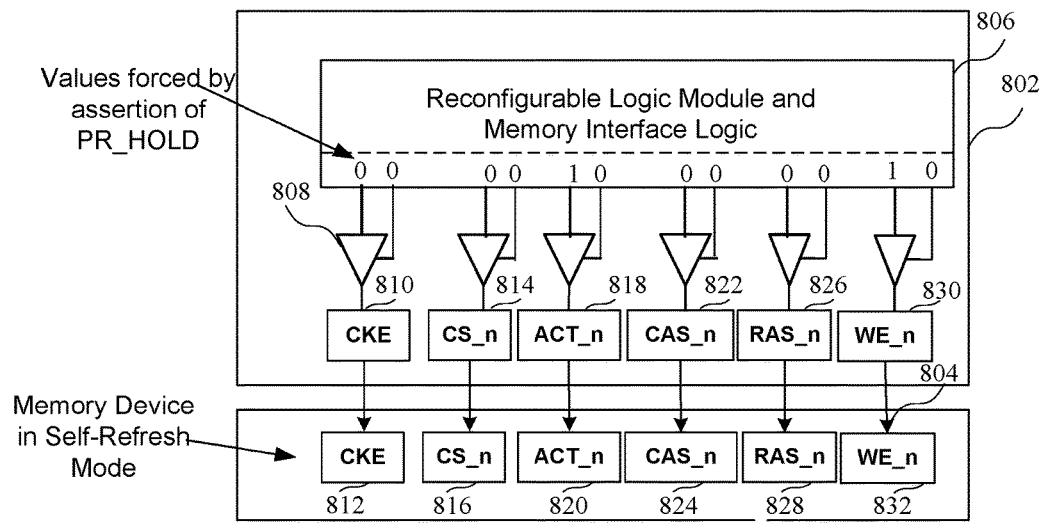
FIG. 9 is a block diagram showing an implementation of an IO circuit coupled to a memory element during a Hold operation.

According to one implementation, the circuits and methods set forth above can be used for holding values of a memory device in a self-refresh mode. As shown in FIG. 8, the interface controller first applies the self-refresh-entry command (CS_n, RAS_n, CAS_n, and CKE held LOW with WE_n and ACT_n HIGH) to the buffers 808, and as shown in FIG. 9 comprises values that are forced by the assertion of a partial reconfiguration hold (PR_HOLD) signal generated by the reconfiguration logic module 806 to keep the memory in self-refresh while the interface controller is reconfigured. That is, the values on the output pads 808, 810, 814, 818, 822, 826, and 830 are held at a certain value during a partial reconfiguration to maintain the self-refresh mode. It should be understood that the circuits 802 and 804 could be implemented on a single IC die, on separate IC die of a single device (e.g. a multi-chip module or board having direct connect IC die), separate die (such as direct connect die) on a printed circuit board (PCB), or separate IC packages.

The circuits and methods provide improved performance by eliminating the need to implement decoupling logic between the IO interface and the programmable logic, which may require the use of programmable logic that can otherwise be put to better use, and assert a decoupling control signal when PR is about to occur. The circuits and methods also prevent implementing an IO interface in a reconfigurable module, in which case the interface must be shut down, reprogrammed, and recalibrated before it can be used again. Such an implementation is undesirable because it adds additional time to the partial reconfiguration process, and may also result in the loss of data stored in an external memory, for example.

Figure 10:
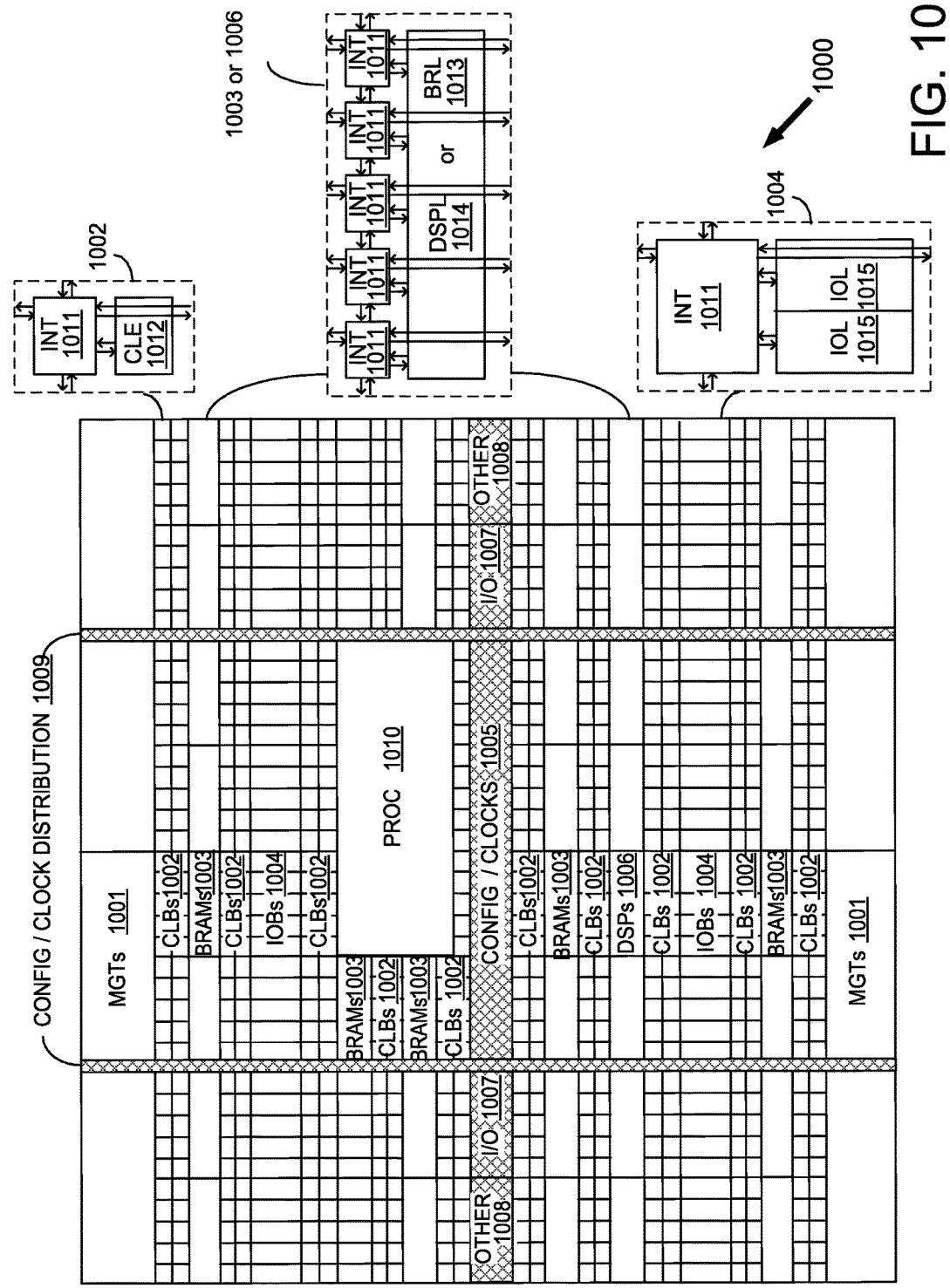
FIG. 10 is another block diagram of a programmable logic device.

Turning now to FIG. 10, another block diagram of a programmable logic device having IO circuits is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream (or configuration data bits sent during a partial reconfiguration) provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 10 comprises an FPGA architecture 1000 having a large number of different programmable tiles including multi-gigabit transceivers (MGTs) 1001, CLBs 1002, random access memory blocks (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007 (e.g., configuration ports and clock ports), and other programmable logic 1008 such as digital clock managers, analog-to-digital converters, system monitoring logic, and so forth. Some FPGAs also include dedicated processor blocks (PROC) 1010, which may be used to implement a software application, for example.

In some FPGAs, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA. The programmable interconnect element 1011 also includes the connections to and from the programmable logic element within the same tile, as shown by the examples included at the top of FIG. 10.

For example, a CLB 1002 may include a configurable logic element (CLE) 1012 that may be programmed to implement user logic plus a single programmable interconnect element 1011. A BRAM 1003 may include a BRAM logic element (BRL) 1013 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1006 may include a DSP logic element (DSPL) 1014 in addition to an appropriate number of programmable interconnect elements. An 10B 1004 may include, for example, two instances of an input/output logic element (IOL) 1015 in addition to one instance of the programmable interconnect element 1011. The circuits and methods could be implemented using the IOL 1015. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1009 extending from this column are used to distribute the clocks and configuration signals across the breadth of the FPGA. Some FPGAs utilizing the architecture illustrated in FIG. 10 include additional logic blocks that disrupt the regular columnar structure making up a large part of the FPGA. The additional logic blocks may be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear in order to facilitate the efficient implementation of user logic. While the implementation of FIG. 10 relates to an integrated circuit having programmable resources, it should be understood that the circuits and methods set forth above could be implemented in any type of device having a combination of programmable resources and hard blocks.

Figure 11:
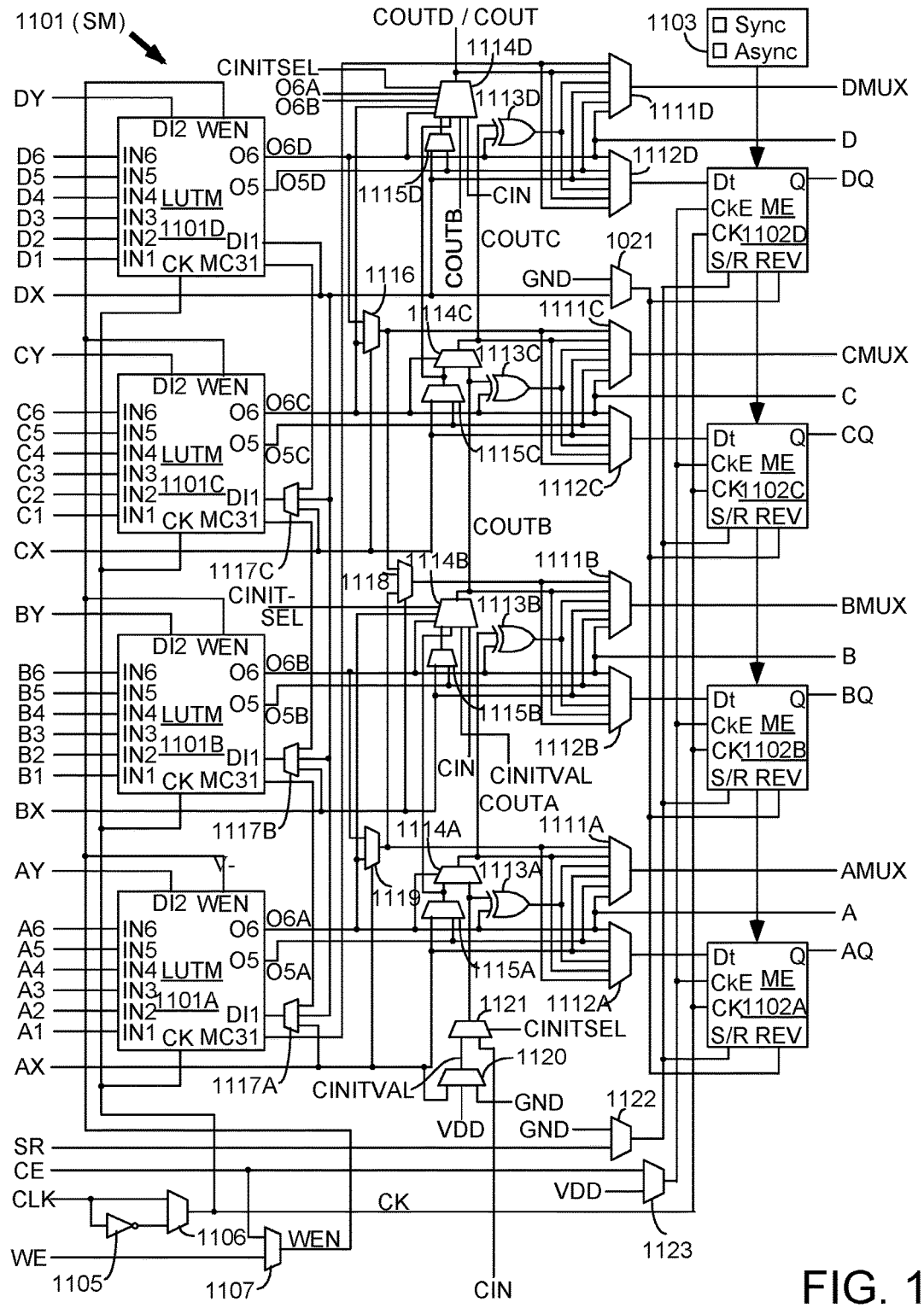
FIG. 11 a block diagram of a configurable logic element of the programmable logic device of FIG. 10.

Turning now to FIG. 11, a block diagram of a configurable logic element that could be implemented in FIG. 10 is shown. In particular, FIG. 11 illustrates in simplified form a configurable logic element, which is an example of Programmable Logic, of a configuration logic block 1002 of FIG. 10. In the implementation of FIG. 11, slice M 1101 includes four lookup tables (LUTMs) 1101A-1101D, each driven by six LUT data input terminals A1-A6, B1-B6, C1-C6, and D1-D6 and each providing two LUT output signals O5 and O6. The O6 output terminals from LUTs 1101A-1101D drive slice output terminals A-D, respectively. The LUT data input signals are supplied by the FPGA interconnect structure via input multiplexers, which may be implemented by programmable interconnect element 1111, and the LUT output signals are also supplied to the interconnect structure. Slice M also includes: output select multiplexers 1111A-1111D driving output terminals AMUX-DMUX; multiplexers 1112A-1112D driving the data input terminals of memory elements 1102A-1102D; combinational multiplexers 1116, 1118, and 1119; bounce multiplexer circuits 1122-1123; a circuit represented by inverter 1105 and multiplexer 1106 (which together provide an optional inversion on the input clock path); and carry logic having multiplexers 1114A-1114D, 1115A-1115D, 1120-1121 and exclusive OR gates 1113A-1113D. All of these elements are coupled together as shown in FIG. 11. Where select inputs are not shown for the multiplexers illustrated in FIG. 11, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 11 for clarity, as well as from other selected figures herein.

In the pictured implementation, each memory element 1102A-1102D may be programmed to function as a synchronous or asynchronous flip-flop or latch. The selection between synchronous and asynchronous functionality is made for all four memory elements in a slice by programming Sync/Asynch selection circuit 1103. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1102A-1102D are clocked by a clock signal CK, which may be provided by a global clock network or by the interconnect structure, for example. Such programmable memory elements are well known in the art of FPGA design. Each memory element 1102A-1102D provides a registered output signal AQ-DQ to the interconnect structure. Because each LUT 1101A-1101D provides two output signals, O5 and O6, the LUT may be configured to function as two 5-input LUTs with five shared input signals (IN1-IN5), or as one 6-input LUT having input signals IN1-IN6.

In the implementation of FIG. 11, each LUTM 1101A-1101D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1117A-1117C for LUTs 1101A-1101C), or to the two 32-bit RAMs via input terminals DI1 and DI2. RAM write operations in the LUT RAMs are controlled by clock signal CK from multiplexer 1106 and by write enable signal WEN from multiplexer 1107, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1101A may also be provided to the general interconnect structure for shift register chaining, via output select multiplexer 1111D and CLE output terminal DMUX. Accordingly, the circuits and methods set forth above may be implemented in a device such as the devices of FIGS. 10 and 11, or any other suitable device.

Figure 12:
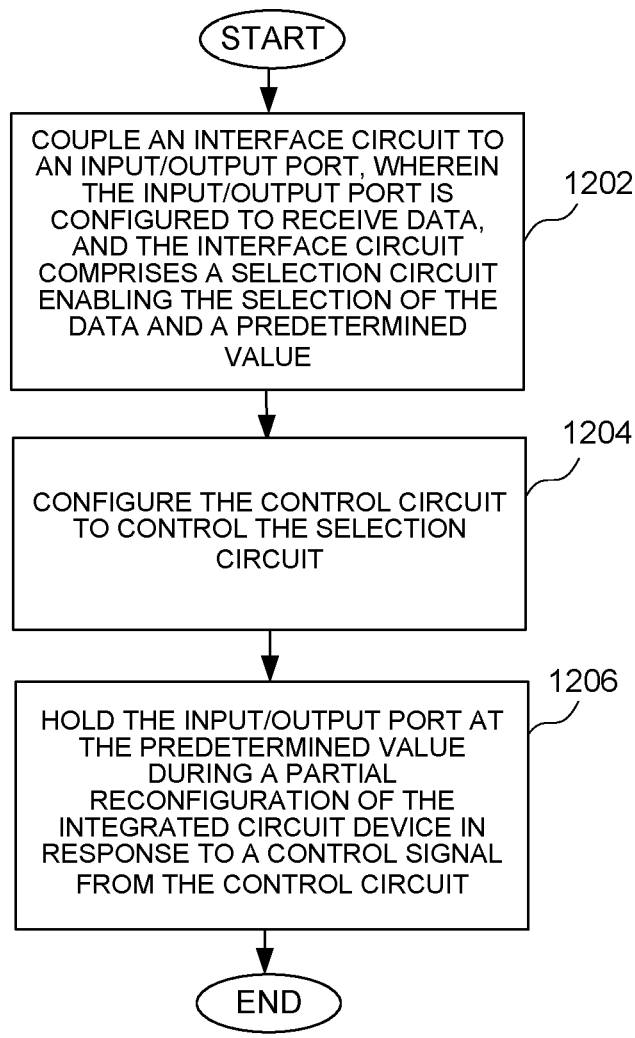
FIG. 12 is a flow chart showing a method of implementing a IO circuit in an integrated circuit device.

Turning now to FIG. 12, a flow chart shows a method of implementing a IO circuit in an integrated circuit device. An interface circuit coupled to an input/output port at a block 1202, wherein the input/output port is configured to receive data, and the interface circuit comprises a selection circuit enabling the selection of the data and a predetermined value. The input/output port could be the input/output ports of FIGS. 2, 3, 4 and 6, for example. The control circuit is configured to control the selection circuit of the interface circuit at a block 1204. The control circuit could be the control circuit of FIGS. 2, 3, 4 and 6, for example. The input/output port is held at the predetermined value, such as a logical zero or a logical one, during a partial reconfiguration of the integrated circuit device in response to a control signal from the control circuit at a block 1206.

According to one implementation, configuring the interface circuit may comprise configuring a multiplexer having a first input to receive the data and a second input to receive the predetermined value. The method may further comprise configuring a register having a data input to receive the data and a data output to generate the data in response to a clock signal. The method may also comprise coupling a tri-state buffer between an output of the selection circuit and the input/output port, and configuring a second register to receive a buffer control signal, wherein the buffer control signal is used to control the tri-state buffer. A second selection circuit having a first input configured to receive the buffer control signal by way of the second register and a second input configured to receive a second predetermined value may be implemented, wherein configuring the second selection circuit comprises configuring a multiplexer having a first input to receive the buffer control signal by way of the second register and a second input to receive the second predetermined value, and wherein an output of the control circuit is coupled to a control terminal of the second selection circuit. The method may further comprise configuring a register to receive the data and a clock signal, and configuring a synchronization circuit to receive the clock signal and generate a synchronized control signal coupled to the selection circuit. Configuring the synchronization circuit may comprise configuring a plurality of registers in series to receive the control signal at a data input and to receive the clock signal, wherein the synchronized control signal is generated at the output of the plurality of registers. As shown and described in reference to FIGS. 8 and 9, a memory may be coupled to the input/output port, wherein a value at the input/output port is held at the predetermined value during the partial reconfiguration.

The method of FIG. 12 may be implemented using the circuits of FIGS. 1-11 as described, or using some other suitable circuits. While specific elements of the method are described, it should be understood that additional elements of the method, or additional details related to the elements, could be implemented according to the disclosure of FIGS. 1-6.

It can therefore be appreciated that new circuits for and methods of implementing IO interfaces in an integrated circuit have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A circuit for routing data in an integrated circuit device, the circuit comprising:
   an input/output port;
   an interface circuit coupled to the input/output port and configured to receive data, the interface circuit comprising a selection circuit enabling a selection of the data or a predetermined value; and
   a control circuit coupled to control the selection circuit;
   wherein the control circuit is configured to receive a first signal indicating that an initial configuration is completed and a second signal indicating that a partial reconfiguration is requested; and
   wherein the control circuit, after the initial configuration is completed, holds the input/output port at the predetermined value during a partial reconfiguration of the integrated circuit device, and enables providing data to the input/output port after the partial reconfiguration.

2. The circuit of claim 1, wherein the selection circuit comprises a multiplexer having a first input configured to receive the data and a second input configured to receive the predetermined value.

3. The circuit of claim 1, further comprising a register having a data input configured to receive the data and a data output configured to generate the data in response to a clock signal, wherein the data is coupled to a first input of the selection circuit.

4. The circuit of claim 1, further comprising a tri-state buffer coupled between an output of the selection circuit and the input/output port.

5. The circuit of claim 4, further comprising a second register having an input for receiving a buffer control signal, wherein the buffer control signal is used to control the tri-state buffer.

6. The circuit of claim 5, further comprising a second selection circuit having a first input configured to receive the buffer control signal by way of the second register and a second input configured to receive a second predetermined value.

7. The circuit of claim 6, wherein the second selection circuit comprises a multiplexer having a first input configured to receive the buffer control signal by way of the second register and a second input configured to receive the second predetermined value, and an output of the control circuit is coupled to a control terminal of the second selection circuit.

8. The circuit of claim 1, further comprising a register configured to receive the data and a clock signal, the circuit further comprising a synchronization circuit configured to receive the clock signal and generate a synchronized control signal coupled to the selection circuit.

9. The circuit of claim 8, wherein the synchronization circuit comprises a plurality of registers coupled in series to receive the synchronized a control signal at a data input and to receive the clock signal, wherein the synchronized control signal is generated at an output of the plurality of registers.

10. The circuit of claim 1, further comprising a memory coupled to the input/output port, wherein a value at the input/output port is held at the predetermined value during the partial reconfiguration of the integrated circuit device.

11. A method of configuring a circuit for routing data in an integrated circuit device, the method comprising:
coupling an interface circuit to an input/output port, wherein the input/output port is configured to receive data, and the interface circuit comprises a selection circuit enabling the selection of the data and a predetermined value;
configuring a control circuit to control the selection circuit, wherein the control circuit is configured to receive a first signal indicating that an initial configuration is completed and a second signal indicating that a partial reconfiguration is requested; and
holding, after an initial configuration is completed, the input/output port at the predetermined value during a partial reconfiguration of the integrated circuit device; and
providing data to the input/output port after the partial reconfiguration.

12. The method of claim 11, wherein configuring an interface circuit comprises configuring a multiplexer having a first input to receive the data and a second input to receive the predetermined value.

13. The method of claim 11, further comprising configuring a register having a data input to receive the data and a data output to generate the data in response to a clock signal.

14. The method of claim 11, further comprising coupling a tri-state buffer between an output of the selection circuit and the input/output port.

15. The method of claim 14, further comprising configuring a second register to receive a buffer control signal, wherein the buffer control signal is used to control the tri-state buffer.

16. The method of claim 15, further comprising configuring a second selection circuit having a first input configured to receive the buffer control signal by way of the second register and a second input configured to receive a second predetermined value.

17. The method of claim 16, wherein configuring the second selection circuit comprises configuring a multiplexer having a first input to receive the buffer control signal by way of the second register and a second input to receive the second predetermined value, and an output of the control circuit is coupled to a control terminal of the second selection circuit.

18. The method of claim 11, further comprising configuring a register to receive the data and a clock signal, and configuring a synchronization circuit to receive the clock signal and generate a synchronized control signal coupled to the selection circuit.

19. The method of claim 18, wherein configuring a synchronization circuit comprises configuring a plurality of registers in series to receive a control signal at a data input and to receive the clock signal, wherein the synchronized control signal is generated at the output of the plurality of registers.

20. The method of claim 11, further comprising coupling a memory to the input/output port, wherein a value at the input/output port is held at the predetermined value during the partial reconfiguration.

* * * * *

UNITED STATES PATENT AND TRADEMARK OFFICE
CERTIFICATE OF CORRECTION

PATENT NO. : 10,541,686 B1
APPLICATION NO. : 16/192053
DATED : January 21, 2020
INVENTOR(S) : David P. Schultz et al.

Page 1 of 1

It is certified that error appears in the above-identified patent and that said Letters Patent is hereby corrected as shown below:

In the Claims

Column 11 Line 38 In Claim 9, after "receive" delete "the synchronized".

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*